(12) United States Patent
Komatsu et al.

(10) Patent No.: US 11,460,767 B2
(45) Date of Patent: Oct. 4, 2022

(54) COMPOSITION FOR FILM FORMATION, FILM-FORMING METHOD AND DIRECTED SELF-ASSEMBLY LITHOGRAPHY PROCESS

(71) Applicant: JSR CORPORATION, Tokyo (JP)

(72) Inventors: Hiroyuki Komatsu, Tokyo (JP); Tomohiro Oda, Tokyo (JP); Hitoshi Osaki, Tokyo (JP); Masafumi Hori, Tokyo (JP); Takehiko Naruoka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 121 days.

(21) Appl. No.: 16/239,592

(22) Filed: Jan. 4, 2019

(65) Prior Publication Data

US 2019/0233561 A1    Aug. 1, 2019

Related U.S. Application Data

(63) Continuation of application No. PCT/JP2017/024875, filed on Jul. 6, 2017.

(30) Foreign Application Priority Data

Jul. 6, 2016 (JP) .............................. JP2016-134633

(51) Int. Cl.
| | | |
|---|---|---|
| G03F 7/00 | (2006.01) | |
| C08F 212/08 | (2006.01) | |
| C08F 212/14 | (2006.01) | |
| C08F 220/12 | (2006.01) | |
| C08F 220/14 | (2006.01) | |
| C09D 201/02 | (2006.01) | |
| H01L 21/027 | (2006.01) | |
| H01L 21/308 | (2006.01) | |
| C09D 133/10 | (2006.01) | |
| G03F 7/38 | (2006.01) | |
| C09D 153/00 | (2006.01) | |

(52) U.S. Cl.
CPC .......... *G03F 7/0002* (2013.01); *C08F 220/12* (2013.01); *C09D 133/10* (2013.01); *C09D 153/00* (2013.01); *C09D 201/02* (2013.01); *G03F 7/38* (2013.01); *H01L 21/027* (2013.01); *H01L 21/0271* (2013.01); *H01L 21/3081* (2013.01)

(58) Field of Classification Search
CPC .... C08F 212/08; C08F 212/24; C08F 220/12; C08F 220/14; G03F 7/0002
See application file for complete search history.

(56) References Cited

U.S. PATENT DOCUMENTS

| | | | |
|---|---|---|---|
| 7,037,738 B2 | 5/2006 | Sugiyama et al. | |
| 9,574,104 B1 * | 2/2017 | Kim | ..................... C09D 125/14 |
| 2001/0024684 A1 | 9/2001 | Steiner et al. | |
| 2003/0178626 A1 | 9/2003 | Sugiyama et al. | |
| 2005/0145864 A1 | 7/2005 | Sugiyama et al. | |
| 2009/0214823 A1 | 8/2009 | Cheng et al. | |
| 2011/0147983 A1 * | 6/2011 | Cheng | ........................ G03F 7/40 264/220 |
| 2011/0147985 A1 * | 6/2011 | Cheng | ..................... G03F 7/165 264/225 |
| 2013/0078576 A1 * | 3/2013 | Wu | ........................ C08F 293/00 430/296 |
| 2014/0030652 A1 * | 1/2014 | Senzaki | ............... C09D 125/14 430/270.1 |
| 2014/0113236 A1 * | 4/2014 | Senzaki | .................. G03F 7/325 430/325 |
| 2014/0299969 A1 * | 10/2014 | Xu | ..................... H01L 21/31133 525/289 |
| 2015/0184017 A1 * | 7/2015 | Hustad | .............. H01L 21/31138 438/703 |
| 2016/0186001 A1 | 6/2016 | Hustad et al. | |
| 2016/0194751 A1 * | 7/2016 | Yahagi | ..................... B05D 1/38 427/372.2 |
| 2017/0107317 A1 * | 4/2017 | Kwon | ................. H01L 21/0271 |

FOREIGN PATENT DOCUMENTS

| | | |
|---|---|---|
| JP | 2002-519728 A | 7/2002 |
| JP | 2003-218383 A | 7/2003 |
| JP | 2008-36491 A | 2/2008 |
| JP | 2008-149447 A | 7/2008 |
| JP | 2010-58403 A | 3/2010 |
| JP | 2011-59583 A | 3/2011 |
| JP | 2012-174984 A | 9/2012 |
| JP | 2013-212489 A | 10/2013 |
| JP | 2014-78540 A | 5/2014 |
| JP | 2015-168732 A | 9/2015 |
| JP | 2016-108436 A | 6/2016 |
| WO | WO 2014/184114 A1 | 11/2014 |
| WO | WO 2015/091047 A1 | 6/2015 |

OTHER PUBLICATIONS

Office Action dated Dec. 8, 2020 in Japanese Patent Application No. 2018-526447 (with unedited computer-generated English translation).

International Search Report dated Aug. 22, 2017 in PCT/JP2017/024875 (with English translation), 5 pages.

(Continued)

*Primary Examiner* — John S Chu
(74) *Attorney, Agent, or Firm* — Element IP, PLC

(57) ABSTRACT

A composition for film formation includes a polymer and a solvent. The polymer includes a first repeating unit, a second repeating unit, a third repeating unit, and a structural unit on at least one end of a main chain of the polymer. The first repeating unit includes a crosslinkable group. The second repeating unit differs from the first repeating unit. The third repeating unit differs from the first repeating unit and has higher polarity than polarity of the second repeating unit. The structural unit includes an interacting group capable of interacting with Si—OH, Si—H or Si—N.

17 Claims, 2 Drawing Sheets

(56) References Cited

OTHER PUBLICATIONS

Written Opinion of the International Searching Authority dated Aug. 22, 2017 in PCT/JP2017/024875 (with English translation), 10 pages.
Office Action dated May 25, 2021 in Japanese Patent Application No. 2018-526447 (with machine-generated English translation), 5 pages.
Office Action dated Mar. 21, 2022 in Korean Patent Application No. 10-2019-7000050 (with machine-generated English translation), 11 pages.

* cited by examiner

COMPOSITION FOR FILM FORMATION, FILM-FORMING METHOD AND DIRECTED SELF-ASSEMBLY LITHOGRAPHY PROCESS

CROSS-REFERENCE TO RELATED APPLICATIONS

The present application is a continuation application of International Application No. PCT/JP2017/024875, filed Jul. 6, 2017, which claims priority to Japanese Patent Application No. 2016-134633, filed Jul. 6, 2016. The contents of these applications are incorporated herein by reference in their entirety.

BACKGROUND OF THE INVENTION

Field of the Invention

The present invention relates to a composition for film formation, a film-forming method and a directed self-assembly lithography process.

Discussion of the Background

Miniaturization of structures of various types of electronic devices such as semiconductor devices and liquid crystal devices has been accompanied by demands for microfabrication of patterns in pattern-forming steps. In these days, although fine patterns having a line width of about 50 nm can be formed using, for example, an ArF excimer laser, further finer pattern formation has been required.

To meet the demands described above, a directed self-assembly lithography process which utilizes a phase separation structure constructed through directed self-assembly, as generally referred to, that spontaneously forms an ordered pattern has been proposed. As such a directed self-assembly lithography process, a method for forming an ultrafine pattern by directed self-assembly using a block copolymer that includes blocks having different properties from one another has been known (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). In addition, a method of forming a fine pattern by permitting directed self-assembly of a composition that contains a plurality of polymers having properties that are different from one another has been also known (see U.S. Patent Application, Publication No. 2009/0214823, and Japanese Unexamined Patent Application, Publication No. 2010-58403). According to these methods, annealing of a film containing the polymer results in a tendency of clustering of polymer structures having the same property, and thus a pattern can be formed in a self-aligning manner.

It has been known that in such a directed self-assembly lithography process, formation of a film containing a component such as a polymer which should be subjected to the directed self-assembly on a base may effectively cause phase separation owing to the directed self-assembly. A variety of studies have been made in connection with the base, and formation of a variety of phase separation structures is reportedly enabled by appropriately controlling the surface free energy of the base in permitting the directed self-assembly of the block copolymer (see Japanese Unexamined Patent Application, Publication No. 2008-36491, and Japanese Unexamined Patent Application, Publication No. 2012-174984).

Furthermore, not only for the directed self-assembly lithography process described above, a material that enables a substrate surface region to be conveniently covered or modified for forming a fine pattern by a lift-off process or the like has been demanded.

SUMMARY OF THE INVENTION

According to an aspect of the present invention, a composition for film formation includes a polymer and a solvent. The polymer includes a first repeating unit, a second repeating unit, a third repeating unit, and a structural unit on at least one end of a main chain of the polymer. The first repeating unit includes a crosslinkable group. The second repeating unit differs from the first repeating unit. The third repeating unit differs from the first repeating unit and has higher polarity than polarity of the second repeating unit. The structural unit includes an interacting group capable of interacting with Si—OH, Si—H or Si—N.

According to another aspect of the present invention, a film-forming method includes: applying the composition directly or indirectly on at least an upper face side of a substrate to form a coating film; and heating the coating film.

According to further aspect of the present invention, a directed self-assembly lithography process includes applying the composition directly or indirectly on at least an upper face side of a substrate to form a coating film. The coating film is heated to form a base. The composition including a block copolymer and a solvent is applied directly or indirectly on an upper face side of the base to form a block copolymer film. The phase separation is allowed in the block copolymer film to form a plurality of phases. One phase of the plurality of phases is removed from the block polymer film to form a resist pattern. The substrate is etched using directly or indirectly the resist pattern as a mask.

DESCRIPTION OF EMBODIMENTS

Figure 1:
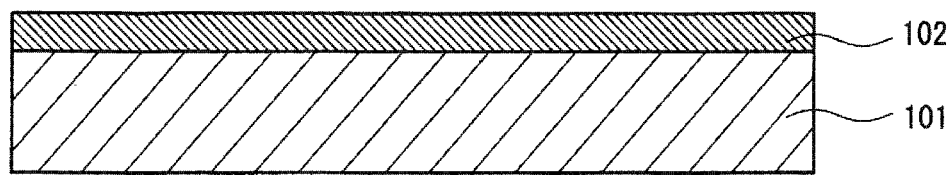
FIG. 1 shows a schematic cross sectional view illustrating one example of a state after providing a base on a substrate.
Figure 2:
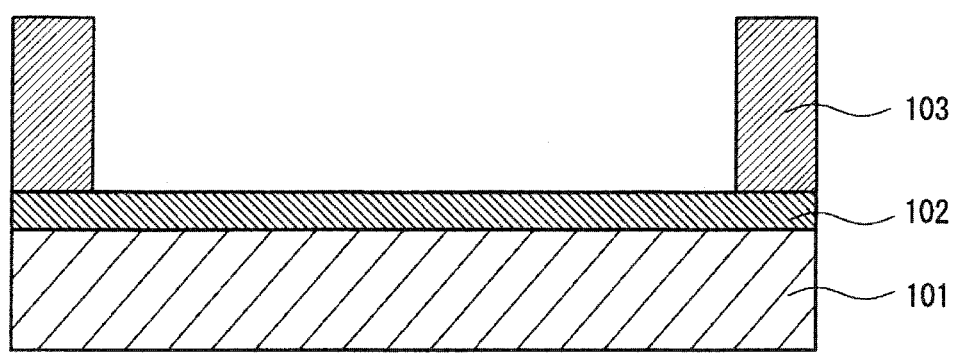
FIG. 2 shows a schematic cross sectional view illustrating one example of a state after forming a prepattern on the base.

According to one embodiment of the invention, a composition for film formation comprises a polymer (hereinafter, may be also referred to as "(A) polymer" or "polymer (A)") and a solvent (hereinafter, may be also referred to as "(B) solvent" of "solvent (B)"), wherein
the polymer comprises:
a first repeating unit (hereinafter, may be also referred to as "repeating unit (I)") comprising a crosslinkable group;
a second repeating unit (hereinafter, may be also referred to as "repeating unit (II)") that differs from the repeating unit (I); and a third repeating unit (hereinafter, may be also referred to as "repeating unit (III)") that differs from the repeating unit (I) and has higher polarity than that of the repeating unit (II), and the polymer comprises a structural unit (hereinafter, may be also referred to as "structural unit (X)") which comprises on at least one end of a main chain thereof a first group (hereinafter, may be also referred to as "group (X)") capable of interacting with Si—OH, Si—H or Si—N.

According to other embodiment of the invention, a film-forming method comprises: applying the composition for film formation according to the one embodiment of the invention directly or indirectly on at least one face side of a substrate; and heating a coating film formed after the applying.

According to still other embodiment of the invention, a directed self-assembly lithography process comprises: applying the composition for film formation according to the one embodiment of the invention directly or indirectly on at least an upper face side of a substrate; heating a coating film formed after the applying of the composition for film formation; applying a composition comprising a block copolymer and a solvent, directly or indirectly on an upper face side of a film formed after the heating; allowing phase separation in a block copolymer film formed after the applying of the composition comprising a block copolymer and a solvent; removing one phase of the block copolymer film after the phase separation; and etching using directly or indirectly a resist pattern formed after the removing.

The term "directed self-assembling" or "directed self assembly" as referred to herein means a phenomenon of spontaneously constructing a tissue or a structure without resulting from only the control from an external factor.

It is to be noted that the term "main chain" as referred to herein means a polymer chain having atomic bonding that includes all repeating units (I), (II) and (III).

The film-forming method and the directed self-assembly lithography process of the embodiments of the present invention enable a phase separation structure through directed self-assembly to be favorably formed, and a pattern to be formed with minimized residues and defects. Therefore, these can be suitably used for pattern-forming steps in manufacture of various types of electronic devices such as semiconductor devices and liquid crystal devices for which further microfabrication is demanded.

Hereinafter, embodiments of the composition for film formation, the film-forming method and the directed self-assembly lithography process of the present invention will be described in detail.

Composition for Film Formation

The composition for film formation of one embodiment of the present invention is suitably used for formation of a film that is superior in heat resistance, substrate adhesiveness and the like through applying directly or indirectly on at least one face side of a substrate, in particular, for formation of a base of a directed self-assembled film in a directed self-assembly lithography process The composition for film formation contains the polymer (A) and the solvent (B). The composition for film formation may contain an optional component within a range not leading to impairment of the effects of the present invention. Each component will be explained below.

(A) Polymer

The polymer (A) has the repeating unit (I), the repeating unit (II) and the repeating unit (III), and has the structural unit (X) which includes on at least one end of a main chain thereof the group (X) capable of interacting with Si—OH, Si—H or Si—N. The polymer (A) may have the repeating units (I) to (III) either in a random or block wise arrangement. In other words, the polymer (A) may be either a random copolymer or a block copolymer, and in light of more inhibition of residues and defects of the pattern, the random copolymer is preferred. The polymer (A) may have one, or two ore more types of the repeating units (I) to (III).

The composition for film formation is capable of forming a phase separation structure favorably through directed self-assembly, and enabling a pattern to be formed with minimized residues and defects, due to containing the polymer (A) having the repeating units (I) to (III), and having the structural unit (X) on at least one end of a main chain thereof. Although not necessarily clarified and without wishing to be bound by any theory, the reason for achieving the effects described above due to the composition for film formation having the aforementioned constitution is inferred as in the following, for example. The polymer (A) has the repeating unit (I) including a crosslinkable group, and has the structural unit (X) including on its end the group (X) capable of interacting with Si—OH, Si—H or Si—N. Due to the composition for film formation applied having the structural unit (X), the polymer (A) is capable of existing with high density on the surface of the substrate through the interaction with Si—OH, Si—H or Si—N on the substrate. In addition, through including the repeating unit (I) and heating etc. carried out after the application, formation of a film having a great film thickness and a film density through bonding of polymer chains is enabled due to the presence of the repeating unit (I). As a result, an effect of the film of covering or modifying the substrate surface such as a base film for a directed self-assembled film can be enhanced.

Hereinafter, the repeating units (I) to (III) and the structural unit (X) are explained.

Repeating Unit (I)

The repeating unit (I) includes a crosslinkable group. The "crosslinkable group" as referred to herein means a group that is capable of forming a cross-linked structure through a reaction under baking conditions, heating conditions, active energy ray-irradiated conditions, acidic conditions and the like.

Examples of the crosslinkable group include:

carbon-carbon double bond-containing groups such as a vinyl group, a vinyloxy group, an allyl group, a (meth) acryloyl group and a styryl group;

carbon-carbon triple bond-containing groups such as an ethynyl group, a propargyl group, a propargyloxy group and a propargylamino group;

cyclic ether groups such as an oxiranyl group, an oxiranyloxy group, an oxetanyl group and an oxetanyloxy group;

aryl groups fused to a cyclobutane ring such as a phenyl group fused to a cyclobutane ring, and a naphthyl group fused to a cyclobutane ring;

aryl groups bonded to a phenolic hydroxyl group protected with an acid group or a heat-labile group such as an acetoxyphenyl group and a t-butoxyphenyl group;

aryl groups bonded to a methylol group (—CH$_2$OH) protected with an acid group or a heat-labile group such as an acetoxymethylphenyl group and a methoxymethylphenyl group;

aryl groups bonded to a substituted or unsubstituted sulfanilmethyl group (—CH$_2$SH) such as a sulfanilmethylphenyl group and a methylsulfanimethylphenyl group; and the like.

The aryl groups fused to a cyclobutane ring form a covalent bond with one another under heating conditions.

The "acid group" as referred to herein is a group derived from an acid by removing OH, and means a group that protects a phenolic hydroxyl group or a methylol group by substituting for a hydrogen atom. The "heat-labile group" as referred to herein is a group that substitutes for a hydrogen atom of a phenolic hydroxyl group, a methylol group or a sulfanilmethyl group, and means a group that dissociates by heating.

Examples of the acid group in the aryl group bonded to a protected phenolic hydroxyl group, methylol group or sulfanilmethyl group include a formyl group, an acetyl group, a propionyl group, a butyryl group, a benzoyl group and the like.

Examples of the heat-labile group in the aryl group bonded to a protected phenolic hydroxyl group include tertiary alkyl groups such as a t-butyl group and a t-amyl group, and the like. Examples of the heat-labile group in the aryl group bonded to a protected methylol group or sulfanilmethyl group include alkyl groups such as a methyl group, an ethyl group and a propyl group, and the like.

Of these, the crosslinkable group is preferably the carbon-carbon double bond-containing group, the aryl group fused to a cyclobutane ring, or the aryl group bonded to a phenolic hydroxyl group or methylol group protected with an acid group or a heat-labile group, more preferably the carbon-carbon double bond-containing group, the aryl group fused to a cyclobutane ring or the phenolic hydroxyl group protected with the acid group or the heat-labile group, and still more preferably a vinyloxy group, an allyl group, a phenyl group fused to a cyclobutane ring, or a t-butoxyphenyl group.

Examples of the repeating unit (I) include a repeating unit derived from a vinyl compound having a crosslinkable group, a repeating unit derived from a (meth)acryl compound having a crosslinkable group, and the like.

The repeating unit (I) is preferably a repeating unit derived from a (meth)acryl compound having a carbon-carbon double bond-containing group, a repeating unit derived from a vinyl compound having an aryl group fused to a cyclobutane ring, or a repeating unit derived from a vinyl compound having a phenolic hydroxyl group protected with an acid group or a heat-labile group, and more preferably a repeating unit derived from 2-(2-vinyloxyethoxy) ethyl (meth)acrylate, a repeating unit derived from allyl (meth)acrylate, a repeating unit derived from 4-vinylbenzocyclobutene, or a repeating unit derived from t-butoxystyrene.

The lower limit of the proportion of the repeating unit (I) contained with respect to all repeating units constituting the polymer (A) is preferably 0.1 mol %, more preferably 1 mol %, still more preferably 3 mol %, and particularly preferably 4 mol %. The upper limit of the proportion of the repeating unit (I) is preferably 30 mol %, more preferably 15 mol %, still more preferably 10 mol %, and particularly preferably 8 mol %.

Repeating Units (II) and (III)

The repeating unit (II) and the repeating unit (III) differ from the repeating unit (I). The repeating unit (III) has higher polarity than that of the repeating unit (II).

Examples of the repeating unit (II) and the repeating unit (III) include a repeating unit derived from a substituted or unsubstituted styrene, a repeating unit derived from a (meth) acrylic acid ester, a repeating unit including an Si—O bond in a main chain thereof, a repeating unit derived from a hydroxycarboxylic acid, a repeating unit derived from an alkylene carbonate, a repeating unit derived from an alkylene glycol, and the like.

The repeating unit derived from a hydroxycarboxylic acid includes —COO— in a main chain thereof. The repeating unit derived from an alkylene carbonate includes a —OCOO— group and an alkylene group in a main chain thereof. The repeating unit derived from polyalkylene glycol includes a polyalkylene glycol chain in a main chain thereof.

Examples of the monomer that gives the repeating unit derived from a substituted or unsubstituted styrene include:
  styrene;
  substituted styrenes, e.g.,
  electron-donating group-substituted styrenes such as α-methylstyrene, o-methylstyrene, m-methylstyrene, p-methylstyrene, p-t-butylstyrene, 2,4,6-trimethylstyrene, p-methoxystyrene, p-t-butoxystyrene, o-vinylstyrene, m-vinylstyrene and p-vinylstyrene;
  electron attractive group-substituted styrenes such as o-hydroxystyrene, m-hydroxystryrene, p-hydroxystyrene, m-chloromethylstyrene, p-chloromethylstyrene, p-chlorostyrene, p-bromostyrene, p-iodostyrene, p-nitrostyrene and p-cyano styrene, and the like.

Examples of the monomer that gives the repeating unit derived from a (meth)acrylic acid ester include:
  (meth)acrylic acid alkyl esters such as methyl (meth)acrylate, ethyl (meth)acrylate, t-butyl (meth)acrylate and 2-ethylhexyl (meth)acrylate;
  alicyclic (meth)acrylate hydrocarbon group esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;
  (meth)acrylic acid aryl esters such as phenyl (meth)acrylate and naphthyl (meth)acrylate;
  (meth)acrylic acid-substituted alkyl esters such as 2-hydroxyethyl (meth)acrylate, 3-hydroxyadamantyl (meth)acrylate and 3-glycidylpropyl (meth)acrylate; and the like.

Examples of the repeating unit having an Si—O bond in a main chain thereof include a polydimethylsiloxane chain, a polymethylphenylsiloxane chain and the like.

Examples of the monomer that gives the repeating unit derived from hydroxycarboxylic acid include glycolic acid, lactic acid, 3-hydroxypropanoic acid, 4-hydroxybutanoic acid, esters of these acids, lactides of these acids and esters, and the like.

Examples of the monomer that gives the repeating unit derived from an alkylene carbonate include ethylene carbonate, trimethylene carbonate, tetramethylene carbonate, and the like.

Examples of the monomer that gives the repeating unit derived from an alkylene glycol include ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and the like.

The repeating unit (II) is preferably a repeating unit having an aromatic ring, and more preferably a repeating unit derived from a substituted or unsubstituted styrene.

The repeating unit (III) is preferably a repeating unit derived from a (meth)acrylic acid ester, a repeating unit having an Si—O bond in a main chain thereof, a repeating unit derived from a hydroxycarboxylic acid or a repeating unit derived from an alkylene carbonate.

The lower limit of the proportion of the repeating unit (II) contained with respect to all repeating units constituting the polymer (A) is preferably 20 mol %, more preferably 40 mol %, and still more preferably 60 mol %. The upper limit of the proportion of the repeating unit (II) is preferably 90 mol %, more preferably 80 mol %, and still more preferably 75 mol %.

The lower limit of the proportion of the repeating unit (III) contained with respect to all repeating units constituting the polymer (A) is preferably 5 mol %, more preferably 10 mol %, and still more preferably 20 mol %. The upper limit of the proportion of the repeating unit (II) is preferably 70 mol %, more preferably 50 mol %, and still more preferably 30 mol %.

Structural Unit (X)

The structural unit (X) is present on at least one end of the main chain and includes the group (X). The group (X) interacts with Si—OH, Si—H or Si—N.

The term "interacting" with Si—OH, Si—H or Si—N as referred to herein means, for example, forming a chemical bond therebetween, for example. The term "chemical bond" as referred to herein means a concept involving a covalent bond, an ionic bond, a metallic bond and a coordinate bond, as well as a hydrogen bond and an electrostatic attractive force between molecules, and is preferably a covalent bond, an ionic bond, a metallic bond or a coordinate bond.

Examples of the group (X) include a hydroxy group, a carboxy group, an amino group, a sulfanil group, and the like. Of these, at least one of a hydroxy group and a carboxy group is preferred, and a hydroxy group is more preferred.

Examples of the structural unit (X) include a structural unit derived from a (meth)acryl compound having the group (X), a structural unit derived from a vinyl compound having group (X), and the like.

The structural unit (X) is preferably a structural unit derived from a (meth)acryl compound having a hydroxy group, or a structural unit derived from a vinyl compound having a hydroxy group, more preferably a structural unit derived from a (meth)acryl compound having a hydroxy group, still more preferably a structural unit derived from hydroxyalkyl (meth)acrylate, and particularly preferably a repeating unit derived from 2-hydroxyethyl (meth)acrylate.

The structural unit (X) may be present on either one end of the main chain thereof or both two ends of the main chain thereof. However, in light of ease in synthesis of the polymer (A), it is preferably present on only one end of the main chain.

Synthesis Method of Polymer (A)

The polymer (A) may be synthesized by, for example, a method including: charging monomers that give the repeating units (I) to (III), copper (II) bromide and an amine compound such as tris[(2-dimethylamino)ethyl]amine, with the solvent such as anisole; and adding thereto a halogenated compound that gives the structural unit (X) such as 2-hydroxyethyl 2-bromoisobutyrate, thereby providing a polymer having the repeating units (I) to (III), and having the structural unit (X) on one end of the main chain thereof through atom transfer radical polymerization.

The lower limit of Mw of the polymer (A) is preferably 1,500, more preferably 4,000, and still more preferably 6,000. The upper limit of Mw is preferably 50,000, more preferably 20,000, and still more preferably 10,000.

The lower limit of Mn of the polymer (A) is preferably 1,000, more preferably 3,000, and still more preferably 5,000. The upper limit of Mw is preferably 40,000, more preferably 15,000, and still more preferably 8,000.

The upper limit of Mw/Mn of the polymer (A) is preferably 5, more preferably 3, still more preferably 2, particularly preferably 1.5, and further particularly preferably 1.2. The lower limit of Mw/Mn is typically 1, and more preferably 1.1.

B) Solvent

The solvent (B) is not particularly limited, and any solvent may be used as long as it is capable of dissolving or dispersing at least the polymer (A), and the optional component contained as desired.

The solvent (B) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partially etherified solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methylphenyl ether); and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone (methyl-n-pentylketone), ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonyl acetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partially etherified carboxylate solvents such as propylene glycol monomethyl ether acetate;

lactone solvents such as γ-butyrolactone and δ-valerolactone;

polyvalent carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

The solvent (B) is preferably the ester solvent, more preferably the polyhydric alcohol partially etherified carboxylate solvent, still more preferably the polyhydric alcohol partially etherated acetate solvent, and particularly preferably propylene glycol monomethyl ether acetate. The composition for film formation may contain one, or two ore more types of the solvent (B).

Optional Component

The optional component which may be contained in the composition for film formation is exemplified by a surfactant and the like. Containing the optional component in the composition for film formation enables application properties on the substrate and the like to be more improved.

Preparation Method of Composition for Film Formation

The composition for film formation may be prepared by, for example, mixing the polymer (A), the solvent (B) and as needed, the optional component at a certain ratio, and preferably filtering the obtained mixture through a high-density polyethylene filter or the like having a pore size of about 0.45 μm. The lower limit of the solid content concentration of the composition for film formation is preferably 0.01% by mass, more preferably 0.1% by mass, still more preferably 0.5% by mass, and particularly preferably 1.0% by mass. The upper limit of the solid content concentration is preferably 30% by mass, more preferably 10% by mass, still more preferably 5% by mass, and particularly preferably 2% by mass.

The composition for film formation is preferably applied directly or indirectly on at least an upper face side of a substrate having Si—OH, Si—H and/or Si—N at least on the surface layer thereof. Furthermore, the composition for film formation is preferably used for formation of a base of a directed self-assembled film containing a block copolymer having a block including the repeating unit (II) and a block including the repeating unit (III).

Film-Forming Method

The film-forming method includes: applying the composition for film formation directly or indirectly on at least one face side of the substrate; and heating the coating film formed after the applying.

The applying and the heating may be each carried out similarly to the applying step (1) and the heating step in the directed self-assembly lithography process described later.

The substrate on which the composition for film formation is to be applied is exemplified by a silicon substrate such as a silicon wafer, a metal substrate on which a siloxane film is provided, and the like. These substrates usually have Si—OH, Si—H or Si—N at least on their surface layers due to an action of oxygen, water and the like in the air. Also, these substrates may have Si—OH, Si—H or Si—N at least on their surface layers by subjecting to a surface treatment with an acid such as sulfuric acid.

The lower limit of the average thickness of the film obtained by the film-forming method is preferably 1 nm, more preferably 2 nm, and still more preferably 3 nm. The upper limit of the average thickness of the film is preferably 2,000 nm, more preferably 100 nm, and still more preferably 20 nm.

Directed Self-Assembly Lithography Process

The directed self-assembly lithography process includes: applying the composition for film formation according to the one embodiment of the invention directly or indirectly on at least an upper face side of a substrate (hereinafter, may be also referred to as "applying step (1)"); heating a coating film formed after the applying of the composition for film formation (hereinafter, may be also referred to as "heating step"); applying a composition comprising a block copolymer and a solvent, directly or indirectly on an upper face side of a film formed after the heating (hereinafter, may be also referred to as "applying step (2)"); allowing phase separation in a block copolymer film formed after the applying of the composition comprising a block copolymer and a solvent (hereinafter, may be also referred to as "phase separation step"); removing one phase of the block copolymer film after the phase separation (hereinafter, may be also referred to as "removing step"); and etching using directly or indirectly a resist pattern formed after the removing (hereinafter, may be also referred to as "etching step").

The directed self-assembly lithography process may further include after the heating step and before the applying step (2), forming a prepattern on an upper face side of a base formed after the heating (hereinafter, may be also referred to as "prepattern-forming step"), and in this case, removing the prepattern may be further included simultaneously to, before or after the removing step. Each step will be explained below with reference to FIGS. 1 to 5.

Applying Step (1)

In this step, the composition for film formation is applied directly or indirectly on at least one face side of the substrate.

The substrate 101 is exemplified by a a silicon substrate such as a silicon wafer, a metal substrate on which a siloxane film is provided, and the like. These substrates usually have Si—OH, Si—H or Si—N at least on their surface layers due to an action of oxygen, water and the like in the air. Also, these substrates may have Si—OH, Si—H or Si—N at least on their surface layers by subjecting to a surface treatment with an acid such as sulfuric acid.

The applying procedure of the composition for film formation is not particularly limited, and for example, a spin coating method and the like may be exemplified. Accordingly, the coating film is formed.

Heating Step

In this step, the coating film formed after the applying step (1) is heated. Accordingly, a base 102 is formed on the substrate 101 as shown in FIG. 1.

For the heating procedure of the coating film, for example, an oven, a hot plate or the like may be used. The lower limit of the temperature of the heating is preferably 100° C., and more preferably 150° C. The upper limit of the temperature is preferably 400° C., and more preferably 300° C. The lower limit of the heating time period is preferably 10 sec, and more preferably 60 sec. The upper limit of the heating time period is preferably 600 sec, and more preferably 300 sec. The atmosphere during the heating is not particularly limited, and may be either an air atmosphere, or an inert gas atmosphere such as nitrogen gas. In addition, after the heating of the coating film, washing with a solvent such as propylene glycol monomethyl ether acetate (PG-MEA) may be carried out.

The lower limit of the average thickness of the base 102 is preferably 1 nm, more preferably 2 nm, and still more preferably 3 nm. The upper limit of the average thickness is preferably 2,000 nm, more preferably 100 nm, and still more preferably 20 nm.

Prepattern-Forming Step

In this step, a prepattern 103 is formed on the base 102. By carrying out this step, phase separation in forming the directed self-assembling film 105 can be further controlled, thereby enabling a phase separation structure through directed self-assembly to be more favorably formed. More specifically, among the components etc., forming the directed self-assembling film 105, the components etc., having a higher affinity to a lateral face of the prepattern 103 form phases along the prepattern 103, whereas the components etc., having a lower affinity form phases at positions away from the prepattern 103. Accordingly, a phase separation structure through directed self-assembly can be more favorably formed. In addition, according to the material, length, thickness, shape, etc. of the prepattern 103, the formed phase separation structure can be more minutely controlled. Moreover, the prepattern 103 may be partially modified by a partial exposure, laser ablation, and the like. It is to be noted that the prepattern 103 may be appropriately selected depending on the pattern intended to be finally formed, and, for example, a line-and-space pattern, a hole pattern, a pillar pattern, and the like may be employed.

As the procedure for forming the prepattern 103, those similar to well-known resist pattern-forming methods, and the like may be employed. In addition, a conventional composition for resist film formation may be used as the composition for prepattern formation. In a specific method for formation of the prepattern 103, for example, a chemical amplification resist composition such as "ARX2928JN" available from JSR Corporation is applied on the base 102 to provide a resist film. Next, an exposure is carried out by irradiating a desired region of the resist film with a radioactive ray through a mask having a specific pattern. Examples of the radioactive ray include: far ultraviolet rays such as ArF excimer laser beams and KrF excimer laser beams; ultraviolet rays; electromagnetic waves such as X-rays; charged particle rays such as electron beams; and the like. Of these, far ultraviolet rays are preferred, ArF excimer laser beams and KrF excimer laser beams are more preferred, and ArF excimer laser beams are even more preferred. Subsequently, post exposure baking (PEB) is carried out, followed by development using a developer solution such as an alkaline developer solution or an organic solvent, whereby a desired prepattern 103 can be formed.

It is to be noted that the surface of the prepattern 103 may be subjected to a hydrophilization treatment. In specific treatment methods, a hydrogenation treatment including exposing to hydrogen plasma for a certain time period, and the like may be adopted. An increase of the hydrophilicity of the surface of the prepattern 103 enables the aforementioned directed self-assembly to be accelerated through an increase in Si—OH on the surface, leading to an enhanced interaction with the polymer (A).

Applying Step (2)

Figure 3:
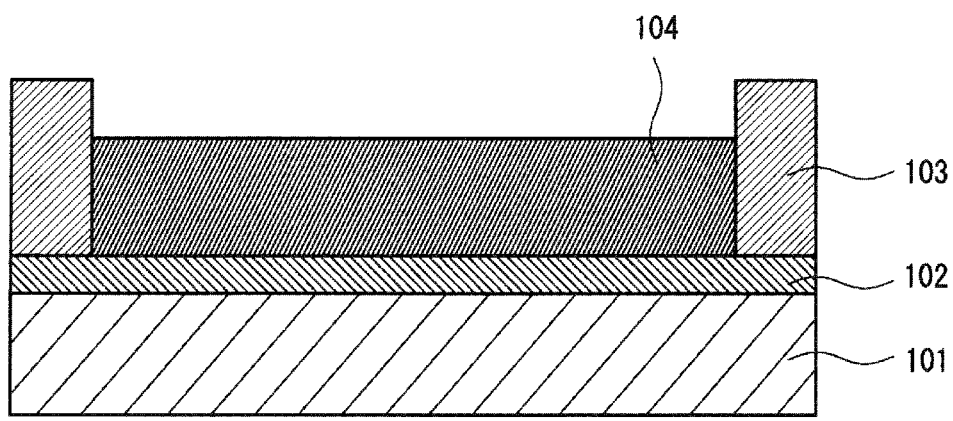
FIG. 3 shows a schematic view illustrating one example of a state after forming a coating film between facing sides of the prepattern using a composition for pattern formation.

In this step, a composition containing a block copolymer and a solvent is applied on an upper face side of the base formed after the heating step. In a case where the prepattern 103 is formed, as shown in FIG. 3, a composition containing a block copolymer and a solvent (hereinafter, may be also referred to as "composition for pattern formation (I)") is applied in a region on the base 102 compartmentalized by the prepattern 103 to obtain a coating film 104. Accordingly, the block copolymer film is formed.

The composition for pattern formation typically contains a block copolymer and a solvent. Any block copolymer may be used as long as it is a polymer having two or more blocks, and may be a diblock copolymer, a triblock copolymer, or a tetrablock copolymer. Of these, in light of a capability of more favorably forming a phase separation structure by directed self-assembly, a diblock copolymer is preferred. Furthermore, in light of capabilities of more favorably forming a phase separation structure by directed self-assembly, and more inhibiting residues and defects, the block copolymer preferably has a block including the repeating unit (II) and a block including the repeating unit (III) of the polymer (A) in the composition for film formation described above, and more preferably has: a block including a repeating unit derived from a substituted or unsubstituted styrene; and a block including a repeating unit derived from a (meth)acrylic acid ester.

The applying procedure of the composition is not particularly limited, and is exemplified by a spin-coating method and the like.

Phase Separation Step

Figure 4:
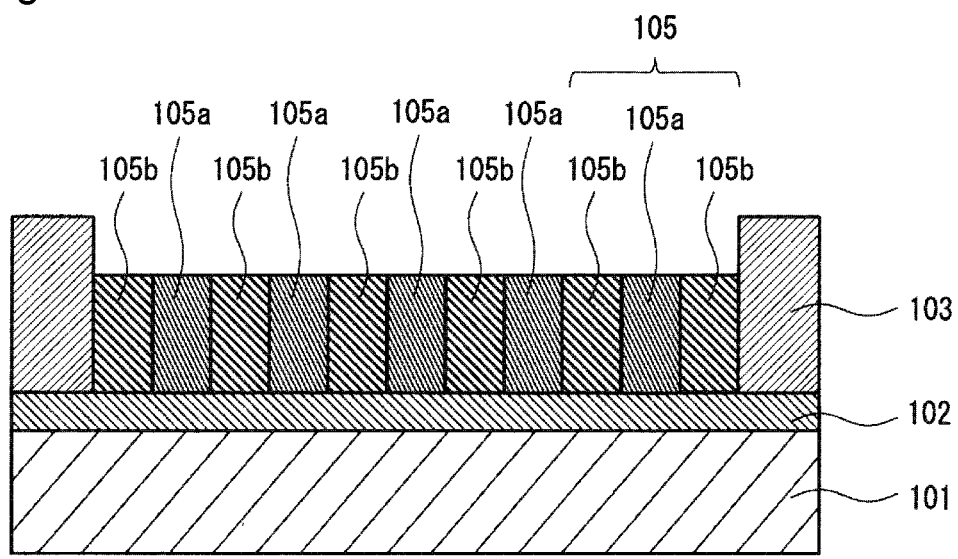
FIG. 4 shows a schematic view illustrating one example of a state after forming a directed self-assembled film.

In this step, the block copolymer film formed after the applying is subjected to phase separation. Accordingly, as shown in FIG. 4, a directed self-assembled film 105 having a phase separation structure is formed. The phase separation procedure is exemplified by an annealing procedure and the like.

For the annealing procedure, for example, an oven, a hot plate or the like may be used. The lower limit of the annealing temperature is preferably 80° C., and more preferably 150° C. The upper limit of the annealing temperature is preferably 400° C., and more preferably 300° C. The lower limit of the annealing time period is preferably 10 sec, and more preferably 30 sec. The upper limit of the annealing time period is preferably 120 min, and more preferably 10 min. The lower limit of the average thickness of the directed self-assembled film 105 is preferably 0.1 nm, and more preferably 0.5 nm. The upper limit of the average thickness is preferably 500 nm, and more preferably 100 nm.

Removing Step

Figure 5:
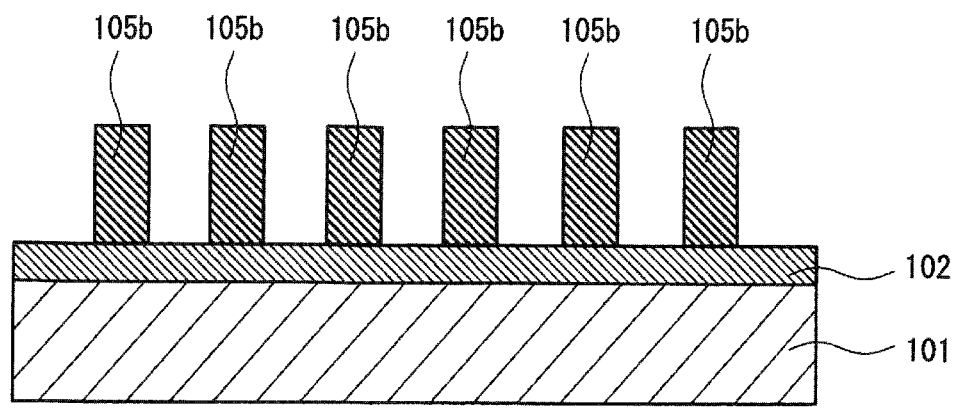
FIG. 5 shows a schematic view illustrating one example of a state after removing a part of a plurality of phases of the directed self-assembled film and the prepattern.

In this step, one phase of the block copolymer film after the phase separation is removed. For example, as shown in FIGS. 4 and 5, a part of block phases, i.e., block phase 105a, in the phase separation structure included in the directed self-assembled film 105 is removed.

Using the difference in the etching rate of each phase generated by phase separation through the directed self-assembly, the block phase 105a can be removed by an etching treatment. A state attained after removing the block phase 105a in the phase separation structure and the prepattern 103 as described later is shown in FIG. 5. It is to be noted that before the etching treatment, an irradiation with a radioactive ray may be carried out as needed. As the radioactive ray, in a case where the block phase 105a is a polymethyl methacrylate block phase, a radioactive ray of 254 nm may be used, for example. Since the irradiation with the radioactive ray leads to decomposition of the polymethyl methacrylate block phase, the etching may be more facilitated.

As the removing procedure of the block phase 105a in the phase separation structure included in the directed self-assembled film 105, well-known procedures e.g., reactive ion etching (RIE) such as chemical dry etching and chemical wet etching; physical etching such as sputter etching and ion beam etching; and the like may be exemplified. Among these, in a case of the polymethyl methacrylate block phase, reactive ion etching (RIE) is preferred, and chemical dry etching carried out by using a $CF_4$ gas, an $O_2$ gas or the like, and chemical wet etching (wet development) carried out by using an etching solution such as an organic solvent or hydrofluoric acid are more preferred. Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, 2-butanone, 4-methyl-2-pentanone and 2-heptanone; alcohols such as methanol, ethanol, 1-propanol, 2-propanol and 4-methyl-2-pentanol; and the like. These solvents may be used either alone, or two or more types thereof may be used in combination.

Prepattern-Removing Step

In this step, the prepattern 103 is removed as shown in FIGS. 4 and 5. By removing the prepattern 103, formation of a finer and more complicated pattern is enabled. It is to be noted that with respect to the removing procedure of the prepattern 103, description regarding the removing procedure of the part of the block phases, i.e., the block phase 105a, in the phase separation structure is applicable. Furthermore, this step may be carried out simultaneously with the removing step described above, or may be carried put before or after the removing step.

Etching Step

In this step, etching is carried out by directly or indirectly using the resist pattern formed through the removing step.

According to this step, for example, after the removing step, the base and the substrate are etched by using as a mask a resist pattern consisting of the block phase 105b that is a block phase of a part of the phase separation film remaining. After completion of the patterning onto the substrate, the phases used as the mask are removed from the substrate by a dissolving treatment or the like, whereby a patterned substrate (pattern) can be finally obtained. As the etching procedure, a procedure similar to that exemplified in connection with the above removing step may be employed, and the etching gas and the etching solution may be appropriately selected in accordance with the materials of the base and the substrate. For example, in a case where the substrate is a silicon material, a gas mixture of chlorofluorocarbon-containing gas and $SF_4$, or the like may be used. The pattern obtained by the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to these Examples. Measuring methods of physical properties are shown below.

Weight Average Molecular Weight (Mw) and Number Average Molecular Weight (Mn)

The Mw and the Mn of the polymer were determined by gel permeation chromatography (GPC) using GPC columns ("G2000 HXL"×2, "G3000 HXL"×1 and "G4000 HXL"×1, available from Tosoh Corporation) under the following condition:

eluent: tetrahydrofuran (Wako Pure Chemical Industries, Ltd.);
flow rate: 1.0 mL/min;
sample concentration: 1.0% by mass;
amount of sample injected: 100 μL;
column temperature: 40° C.;
detector: differential refractometer; and
standard substance: mono-dispersed polystyrene.

$^1$H-NMR Analysis $^1$H-NMR analysis was carried out using a nuclear magnetic resonance apparatus ("JNM-ECX400", available from JEOL, Ltd.). The proportion of each structural unit contained in each polymer was calculated from the area ratio of the peak corresponding to each structural unit in the spectrum obtained by the $^1$H-NMR.

Synthesis of Polymer (A)

Synthesis Example 1

Into a 200-mL three-neck flask equipped with a condenser, a dropping funnel and a thermometer were charged 40 g of anisole, 16.7 g of styrene (0.160 mol), 3.00 g of methyl methacrylate (0.030 mol), 1.30 g of 2-hydroxyethylmethacrylate (0.01 mol), 0.29 g of copper (II) bromide (2.00 mmol) and 0.46 g of tris[(2-dimethylamino)ethyl]amine (2 mmol). After the mixture was heated to 100° C., 0.53 mL of 2-bromoisoethyl butyrate (3.6 mmol) was added thereto, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of tetrahydrofuran (THF) was added to thus resulting concentrate. The mixture was added to 1,000 g of a mix liquid of methanol/ultra pure water (mass ratio 5/5), whereby the polymer was precipitated. Thus resulting solid was collected with a Buechner funnel, and washed with 50 g of methanol. The solid thus obtained was dried under reduced pressure to give 11.2 g of a white polymer (a-1).

The polymer (a-1) had Mw of 5,600, Mn of 4,600, and Mw/Mn of 1.22. In addition, as a result of the $^1$H-NMR analysis, the proportions of a structural unit derived from styrene, a structural unit derived from methyl methacrylate and a structural unit derived from 2-hydroxyethyl methacrylate were 80 mol %, 15 mol % and 5 mol %, respectively.

Synthesis Example 2

Into a 200-mL three-neck flask equipped with a condenser, a dropping funnel and a theimometer were charged 40 g of anisole, 14.6 g of styrene (0.140 mol), 6.00 g of methyl methacrylate (0.060 mol), 0.29 g of copper (II) bromide (2.00 mmol) and 0.46 g of tris[(2-dimethylamino)ethyl]amine (2.0 mmol). After the mixture was heated to 100° C., 0.53 mL of 2-hydroxyethyl 2-bromoisobutyrate (3.6 mmol) was added thereto with a syringe, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of THF was added to thus resulting concentrate. The mixture was added to 1,000 g of a mix liquid of methanol/ultra pure water (mass ratio 5/5), whereby the polymer was precipitated. Thus resulting solid was collected with a Buechner funnel, and washed with 50 g of methanol. The solid thus obtained was dried under reduced pressure to give 11.5 g of a white polymer (a-2).

The polymer (a-2) had Mw of 8,800, Mn of 6,900, and Mw/Mn of 1.23. In addition, as a result of the $^1$H-NMR analysis, the proportions of a structural unit derived from styrene and a structural unit derived from methyl methacrylate were 70 mol % and 30 mol %, respectively.

Synthesis Example 3

Into a 200-mL three-neck flask equipped with a condenser, a dropping funnel and a thermometer were charged 40 g of anisole, 14.6 g of styrene (0.140 mol), 5.61 g of methyl methacrylate (0.056 mol), 0.80 g of 2-(2-vinyloxyethoxy)ethyl methacrylate ("VEEM" available from Nippon Shokubai Co., Ltd.) (0.004 mol), 0.29 g of copper (II) bromide (2.00 mmol) and 0.46 g of tris[(2-dimethylamino)ethyl]amine (2.0 mmol). After the mixture was heated to 100° C., 0.53 mL of 2-hydroxyethyl 2-bromoisobutyrate (3.6 mmol) was added thereto with a syringe, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of THF was added to thus resulting concentrate. The mixture was added to 1,000 g of a mix liquid of methanol/ultra pure water (mass ratio 5/5), whereby the polymer was precipitated. Thus resulting solid was collected with a Buechner funnel, and washed with 50 g of methanol. The solid thus obtained was dried under reduced pressure to give 11.5 g of a white polymer (A-1).

The polymer (A-1) had Mw of 7,300, Mn of 6,400, and Mw/Mn of 1.14. In addition, as a result of the $^1$H-NMR analysis, the proportions of a structural unit derived from styrene, a structural unit derived from methyl methacrylate and a structural unit derived from 2-(2-vinyloxyethoxy)ethyl methacrylate were 70 mol %, 25 mol % and 5 mol %, respectively.

Synthesis Example 4

Into a 200-mL three-neck flask equipped with a condenser, a dropping funnel and a thermometer were charged 40 g of anisole, 14.6 g of styrene (0.140 mol), 5.61 g of methyl methacrylate (0.056 mol), 0.53 g of 4-vinylbenzocyclobutene ("vBCB" available from Amadis chemical Co., Ltd.) (0.004 mol), 0.29 g of copper (II) bromide (2.00 mmol) and 0.46 g of tris[(2-dimethylamino)ethyl]amine (2.0 mmol). After the mixture was heated to 100 ° C., 0.53 mL of 2-hydroxyethyl 2-bromoisobutyrate (3.6 mmol) was added thereto with a syringe, and the mixture was heated while stirring under a nitrogen flow for 8 hrs. A polymerization liquid thus obtained was filtered through Celite to remove a copper complex, and washed with 500 g of ultra pure water three times. The organic layer was recovered and thereafter concentrated, and 50 g of THF was added to thus resulting concentrate. The mixture was added to 1,000 g of a mix liquid of methanol/ultra pure water (mass ratio 5/5), whereby the polymer was precipitated. Thus resulting solid was collected with a Buechner funnel, and washed with 50 g of methanol. The solid thus obtained was dried under reduced pressure to give 11.5 g of a white polymer (A-2).

The polymer (A-2) had Mw of 7,800, Mn of 6,900, and Mw/Mn of 1.13. In addition, as a result of the $^1$H-NMR analysis, the proportions of a structural unit derived from styrene, a structural unit derived from methyl methacrylate and a structural unit derived from 4-vinylbenzocyclobutene were 70 mol %, 25 mol % and 5 mol %, respectively.

Synthesis Example 5

Into a 200-mL three-neck flask equipped with a condenser, a dropping funnel and a thermometer were added 40 g of anisole, 14.6 g of styrene (0.140 mol), 5.61 g of methyl methacrylate (0.056 mol), 0.51 g of allyl methacrylate (0.004 mmol), 0.29 g of copper (II) bromide (2.00 mmol), 0.46 g of tris[(2-dimethylamino)ethyl]amine (2 0 mmol). After the mixture was heated to 100° C., 0.53 mL of 2-hydroxyethyl 2-bromoisobutyrate (3.6 mmol) was added thereto with a syringe, and the mixture was heated while stirring under a nitrogen flow for 8 hrs. A polymerization solution thus obtained was filtered through Celite to remove a copper complex, and washed with 500 g of ultra pure water three times. The organic layer was recovered and thereafter concentrated, and 50 g of tetrahydrofuran was added to the resin solution. The mixture was subjected to purification through precipitation in 1,000 g of methanol/ultra pure water =5/5, whereby the polymer was precipitated. The solid was collected with a Buechner funnel, and rinsed with 50 g of methanol. Thus obtained white solid was dried under reduced pressure to give 11.3 g of (A-3).

The resin (A-3) had Mw of 7,000, Mn of 6,200, and Mw/Mn of 1.13. In addition, as a result of the $^1$H-NMR analysis, 70 mol % of styrene, 25 mol % of methyl methacrylate, and 5 mol % of allyl methacrylate were verified.

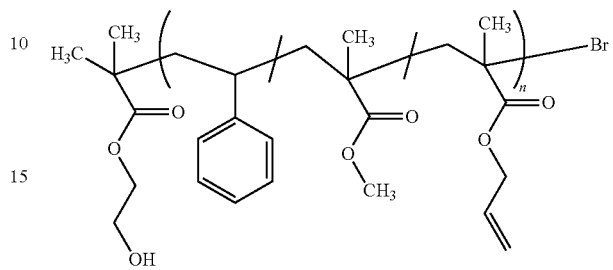

Synthesis Example 6

Into a 200-mL three-neck flask equipped with a condenser, a dropping funnel and a thermometer were added 40 g of anisole, 14.6 g of styrene (0.140 mol), 5.61 g of methyl methacrylate (0.056 mol), 0.71 g of tert-butoxystyrene (0.004 mmol), 0.29 g of copper (II) bromide (2.00 mmol), 0.46 g of tris[(2-dimethylamino)ethyl]amine (2.0 mmol). After the mixture was heated to 100° C., 0.53 mL of 2-hydroxyethyl 2-bromoisobutyrate (3.6 mmol) was added thereto with a syringe, and the mixture was heated while stirring under a nitrogen flow for 8 hrs. A polymerization solution thus obtained was filtered through Celite to remove a copper complex, and washed with 500 g of ultra pure water three times. The organic layer was recovered and thereafter concentrated, and 50 g of tetrahydrofuran was added to the resin solution. The mixture was subjected to purification through precipitation in 1,000 g of methanol/ultra pure water =5/5, whereby the polymer was precipitated. The solid was collected with a Buechner funnel, and rinsed with 50 g of methanol. Thus obtained white solid was dried under reduced pressure to give 11.7 g of (A-4).

The resin (A-4) had Mw of 7,000, Mn of 6,000, and Mw/Mn of 1.17. In addition, as a result of the $^1$H-NMR analysis, 70 mol % of styrene, 25 mol % of methyl methacrylate, and 5 mol % of tert-butoxystyrene were verified.

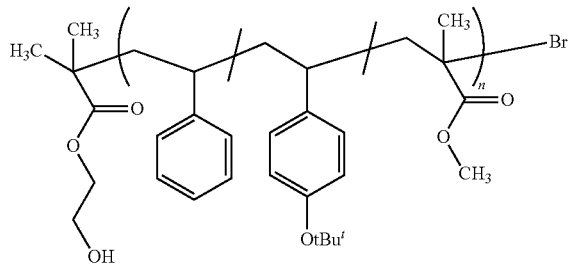

Synthesis of Block Copolymer

Synthesis Example 7

After a 500-mL flask as a reaction vessel was dried under reduced pressure, 200 g of THF, which had been subjected to a dehydrating treatment by distillation, was charged into the flask under a nitrogen atmosphere, and cooled to −78° C. Thereafter, 0.40 mL of a 1 N sec-butyl lithium (sec-BuLi) solution in cyclohexane was charged into this THF, and then 22.1 mL of styrene (0.192 mol), which had been subjected to adsorptive filtration through silica gel for removing a polymerization inhibitor and to a dehydrating treatment by distillation, was added dropwise over 30 min. The polymerization system was ascertained to have an orange color. During this dropwise addition, the internal temperature of the reaction solution was carefully adjusted so as not to be −60° C. or higher. After the completion of the dropwise addition, the mixture was aged for 30 min. Thereafter, 0.15 mL of 1,1-diphenylethylene (0.00107 mol) and 1.42 mL of a 0.5 N lithium chloride solution in THF (0.0007 mol) was added to the mixture, and the polymerization system was ascertained to have a dark red color. Furthermore, 18.0 mL of methyl methacrylate (0.180 mol), which had been subjected to adsorptive filtration through silica gel for removing a polymerization inhibitor and to a dehydrating treatment by distillation, was added dropwise to this solution over 30 min and the polymerization system was ascertained to have a pale yellow color, followed by allowing for a reaction for 120 min. Then, 1 mL of methanol as a chain-end terminator was charged to permit a polymerization-end terminating reaction. The temperature of this reaction solution was elevated to the room temperature, and the resulting reaction solution was concentrated. After replacing with methyl isobutyl ketone (MIBK), 1,000 g of a 2% by mass aqueous oxalic acid solution was added while stirring. Then, after the mixture was left to stand, the underlayer, i.e., an aqueous layer, was discarded. This operation was repeated three times to remove Li salts. Then, 1,000 g of ultra pure water was charged, the mixture was stirred, and then the underlayer, i.e., an aqueous layer, was discarded. This operation was repeated three times to remove oxalic acid. Thereafter, the resulting solution was concentrated, and then the concentrate was added dropwise into 500 g of methanol to permit precipitation of a polymer, which was collected with a Buechner funnel as a solid. Next, in order to remove a homopolymer of polystyrene, 500 g of cyclohexane was poured to the solid, thereby dissolving the polystyrene homopolymer in cyclohexane to wash the block copolymer. This operation was repeated four times, and again the solid was collected with a Buechner funnel. This polymer was dried under reduced pressure at 60° C. to give 37.4 g of a white block copolymer (B-1).

The block copolymer (B-1) had Mw of 58,600, Mn of 57,000, and Mw/Mn of 1.03. In addition, as a result of the $^1$H-NMR analysis, the proportions of a repeating unit derived from a styrene and a repeating unit derived from methyl methacrylate in the block copolymer (A-1) were 50.0% by mass (50.0 mol %) and 50.0% by mass (50.0 mol %), respectively. It is to be noted that the block copolymer (B-1) was a diblock copolymer.

Preparation of Composition for Film Formation

Comparative Example 1

A composition for film formation (CA-1) was prepared by adding 98.8 g of propylene glycol monomethyl ether acetate to 1.2 g of the polymer (a-1) synthesized as described above to permit dissolution, and then filtering the solution through a high-density polyethylene filter having a pore size of 0.45 μm.

Comparative Example 2 and Examples 1 to 4

Compositions for film formation (CA-2), (A-1) to (A-4) were prepared in a similar manner to Comparative Example 1 except that any one of polymers (a-2) and (A-1) to (A-4) was used in place of the polymer (a-1) in Comparative Example 1.

Preparation of Composition for Pattern Formation

A composition for pattern formation (S-1) was prepared by adding 69 g of propylene glycol monomethyl ether acetate and 29.5 g of ethyl lactate to 1.5 g of the block copolymer (B-1) synthesized as described above, stirring the mixture, and then filtering the solution through a high-density polyethylene filter having a pore size of 0.45 μm.

Resist Pattern Formation

Each composition for film formation prepared as described above was spin-coated on a silicon substrate at 1,500 rpm by using a track ("TEL DSA ACT12" available from Tokyo Electron Limited), and baked at 250° C. for 180 sec. The substrate was washed with PGMEA to remove the composition for film formation having been unreacted. The average thickness of the coating film formed on the silicon substrate was about 5 nm as a result of the measurement of the film thickness with an ellipsometer. Next, the composition for pattern formation (S-1) prepared as described above was spin-coated at 1,500 rpm on the substrate having the coating film (base) formed thereon. After the coating film was formed, phase separation was allowed by annealing under nitrogen at 220° C. for 60 sec.

After the substrate having the coating film subjected to phase separation thereon was irradiated with a radioactive ray of 172 nm at an intensity of 300 mJ/cm$^2$, the substrate was immersed in a solution of 2-propanol (IPA) to remove the phase consisting of poly(methyl methacrylate) blocks by dissolving. Accordingly, a line-and-space pattern was formed.

EVALUATIONS

Favorableness, and Residues and Defects of Phase Separation Structure

The finger-print pattern over the substrate after wet development was observed for the phase separation structure by using "CG5000" available from Hitachi High-Technologies Corporation at a magnification of hundred thousand, and the pattern line-width of pitch size was measured. When the compositions for film formation of Examples 1 to 4 were used, the phase separation structure was favorably formed. In contrast, when the compositions for film formation of Comparative Examples 1 and 2 were used, the phase separation structure was not favorably formed.

Next, an image analysis was performed by using FCR function of "Terminal PC" available from Hitachi High-Technologies Corporation, and numbers of the residues and the defects were counted, respectively. The residues/ defects shown in Table 1 below represent the numbers, respectively, found in 100 electron microscopic images obtained by the aforementioned "CG5000".

Contact Angle

With respect to the coating film which was formed in forming the resist pattern (after removing the unreacted composition for film formation), a contact angle of water on the surface of the coating film was measured by using an automatic contact angle scale ("Drop Master DM-501" available from Kyowa Interface Science Co., LTD.). It is to be noted that the contact angle of the polystyrene homopolymer was 90°, and the contact angle of polymethyl methacrylate was 68°.

Surface Tension

With respect to the coating film which was formed in forming the resist pattern (after removing the unreacted composition for film formation), the contact angle of water on the surface of the coating film, and the contact angle of diiodomethane were measured, and the surface free energy was calculated from these measurements.

In Table 1 below, the contact angle, the surface tension (dyn/cm), and the residues/defects and pitch size (nm) are shown for each case in which each composition for film formation prepared as described above was used.

TABLE 1

|  | Comparative Example 1 | Comparative Example 2 | Example 1 | Example 2 | Example 3 | Example 4 |
|---|---|---|---|---|---|---|
| Composition for film formation | CA-1 | CA-2 | A-1 | A-2 | A-3 | A-4 |
| Contact angle (°) | 81 | 82.6 | 78 | 79 | 78 | 78 |
| Surface tension (dyn/cm) | 46.4 | 47.0 | 46.6 | 46.7 | 46.7 | 46.8 |
| Residues/defects | 83/53 | 54/42 | 21/13 | 22/16 | 21/14 | 22/13 |
| Pitch size (nm) | 29.8 | 29.9 | 30.0 | 30.0 | 29.9 | 30.1 |

As is clear from the results shown in Table 3, the compositions for film formation of Examples were capable of forming phase separation structures favorably through directed self-assembly, and enabled a pattern to be formed with minimized residues and defects. The compositions for film formation of Examples enabled drastic reduction in residues and defects as compared with the compositions for film formation of Comparative Examples.

According to the composition for film formation, the film-forming method and the directed self-assembly lithography process of the embodiments of the present invention, favorable forming of a phase separation structure through directed self-assembly, and pattern formation with minimized residues and defects are enabled. Therefore, these can be suitably used for pattern-forming steps in manufacture of various types of electronic devices such as semiconductor devices and liquid crystal devices for which further miniaturization is demanded.

Obviously, numerous modifications and variations of the present invention are possible in light of the above teachings. It is therefore to be understood that within the scope of the appended claims, the invention may be practiced otherwise than as specifically described herein.

The invention claimed is:

1. A composition for film formation comprising a polymer component and a solvent,
wherein the polymer component consists of a polymer which comprises:
a main chain which comprises:
a first repeating unit that comprises a crosslinkable group, and is derived from at least one first monomer selected from the group consisting of 2-(2-vinyloxyethoxy)ethyl (meth)acrylate, allyl (meth)acrylate, 4-vinylbenzocyclobutene, and t-butoxystyrene;
a second repeating unit that differs from the first repeating unit, and is derived from a second monomer which is an unsubstituted styrene; and
a third repeating unit that differs from the first repeating unit, has higher polarity than polarity of the second repeating unit, and is derived from at least one third monomer selected from the group consisting of an (meth)acrylic acid alkyl ester and an alkylene carbonate;
a structural unit comprising a group in which a bromine atom is removed from a 2-hydroxyalkyl 2-bromoisobutyrate, the hydroxy group in the 2-hydroxyalkyl 2-bromoisobutyrate being an interacting group which is capable of interacting with Si—OH, Si—H or Si—N, the structural unit being positioned on one end of the main chain of the polymer; and
a bromine atom which is positioned on the other end of the main chain of the polymer on which the structural unit is not positioned,
wherein the polymer is produced by polymerizing the first monomer, the second monomer, and the third monomer in a presence of the 2-hydroxyalkyl 2-bromoisobutyrate.

2. The composition according to claim 1, which is suitable for a base of a directed self-assembled film in a directed self-assembly lithography process.

3. The composition according to claim 1, which is suitable for formation of a base of a directed self-assembled film, wherein
the directed self-assembled film is to be formed directly or indirectly on at least an upper face side of a substrate comprising Si—OH, Si—H or Si—N at least on a surface layer thereof, and
the directed self-assembled film comprises a block copolymer comprising: a block comprising the second repeating unit; and a block comprising the third repeating unit.

4. A film-forming method comprising:
applying the composition according to claim 1 directly or indirectly on at least an upper face side of a substrate to form a coating film; and
heating the coating film.

5. The film-forming method according to claim 4, wherein the substrate comprises Si—OH, Si—H or Si—N at least on a surface layer thereof.

6. A directed self-assembly lithography process comprising:
applying the composition according to claim 1 directly or indirectly on at least an upper face side of a substrate to form a coating film;
heating the coating film to form a base;
applying a composition comprising a block copolymer and a solvent, directly or indirectly on an upper face side of the base to form a block copolymer film;
allowing phase separation in the block copolymer film to form a plurality of phases;
removing one phase of the plurality of phases from the block polymer film to form a resist pattern; and
etching the substrate using directly or indirectly the resist pattern as a mask.

7. The directed self-assembly lithography process according to claim 6, wherein the substrate comprises Si—OH, Si—H or Si—N at least on a surface layer thereof.

8. The directed self-assembly lithography process according to claim 6, wherein the block copolymer comprises: a block comprising the second repeating unit; and a block comprising the third repeating unit.

9. The composition according to claim 1, wherein a proportion of the second repeating unit with respect to all repeating units constituting the polymer is 60 mol % or more.

10. The composition according to claim 1, wherein a proportion of the third repeating unit with respect to all repeating units constituting the polymer is 50 mol % or less.

11. The composition according to claim 1, wherein the 2-hydroxyalkyl 2-bromoisobutyrate is 2-hydroxyethyl 2-bromoisobutyrate.

12. The composition according to claim 1, wherein the polymer is synthesized through atom transfer radical polymerization.

13. The composition according to claim 1, wherein the main chain of the polymer consists of the first repeating unit, the second repeating unit, and the third repeating unit.

14. The composition according to claim 1, wherein the main chain of the polymer is a random copolymer.

15. The composition according to claim 1, wherein a proportion of the first repeating unit is from 1 to 15 mol % with respect to total repeating units of the polymer, a proportion of the second repeating unit is from 20 to 90 mol % with respect to the total repeating units of the polymer, and a proportion of the third repeating unit is from 5 to 70 mol % with respect to the total repeating units of the polymer.

16. The composition according to claim 1, wherein a proportion of the first repeating unit is from 3 to 10 mol % with respect to total repeating units of the polymer, a proportion of the second repeating unit is from 40 to 80 mol % with respect to the total repeating units of the polymer, and a proportion of the third repeating unit is from 10 to 50 mol % with respect to the total repeating units of the polymer.

17. The composition according to claim 1, wherein a proportion of the first repeating unit is from 4 to 8 mol % with respect to total repeating units of the polymer, a proportion of the second repeating unit is from 60 to 75 mol % with respect to the total repeating units of the polymer, and a proportion of the third repeating unit is from 20 to 30 mol % with respect to the total repeating units of the polymer.

* * * * *